(12) United States Patent
Choi et al.

(10) Patent No.: US 9,417,474 B2
(45) Date of Patent: Aug. 16, 2016

(54) LIQUID CRYSTAL DISPLAY AND MANUFACTURING METHOD THEREOF

(71) Applicant: SAMSUNG DISPLAY CO., LTD., Yongin, Gyeonggi-Do (KR)

(72) Inventors: Sang Gun Choi, Suwon-si (KR); Woo Yong Sung, Seoul (KR); Tae Woon Cha, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 268 days.

(21) Appl. No.: 13/689,518

(22) Filed: Nov. 29, 2012

(65) Prior Publication Data

US 2014/0028925 A1    Jan. 30, 2014

(30) Foreign Application Priority Data

Jul. 30, 2012    (KR) .................. 10-2012-0083359

(51) Int. Cl.
*G02F 1/1335* (2006.01)
*G02F 1/1333* (2006.01)
*H01L 33/08* (2010.01)
*G06F 3/041* (2006.01)
*G02F 1/1362* (2006.01)
*G06F 3/047* (2006.01)

(52) U.S. Cl.
CPC ...... *G02F 1/13338* (2013.01); *G02F 1/136286* (2013.01); *G06F 3/041* (2013.01); *G06F 3/0416* (2013.01); *H01L 33/08* (2013.01); *G06F 3/047* (2013.01)

(58) Field of Classification Search
CPC ..... G06F 3/041; G06F 3/0412; G06F 3/0414; G06F 3/0416; G02F 1/13338
USPC .............................................. 349/12; 345/173
See application file for complete search history.

(56) References Cited

U.S. PATENT DOCUMENTS

| | | | |
|---|---|---|---|
| 6,469,761 B1 | 10/2002 | Drabik et al. | |
| 7,123,319 B2 | 10/2006 | Broer et al. | |
| 8,031,274 B2* | 10/2011 | Sakurai et al. | 349/12 |
| 8,289,457 B2* | 10/2012 | Hwang et al. | 349/12 |
| 2009/0180043 A1* | 7/2009 | Rho et al. | 349/12 |
| 2011/0057892 A1 | 3/2011 | Kwak et al. | |

(Continued)

FOREIGN PATENT DOCUMENTS

| | | |
|---|---|---|
| JP | 2000330130 A | 11/2000 |
| JP | 2010039621 A | 2/2010 |
| KR | 1020020090096 A | 11/2002 |

(Continued)

*Primary Examiner* — Dung Nguyen
(74) *Attorney, Agent, or Firm* — Cantor Colburn LLP

(57) ABSTRACT

A manufacturing method of a liquid crystal display includes: providing a thin film transistor on a substrate; providing a pixel electrode connected to the thin film transistor; providing a microcavity layer including a liquid crystal material on the pixel electrode; providing a supporting member layer on the microcavity layer; patterning the supporting member layer to form a plurality of recess portions therein; and providing a plurality of touch signal lines for transmitting a touch signal in the plurality of recess portions.

9 Claims, 18 Drawing Sheets

(56) References Cited

U.S. PATENT DOCUMENTS

| | | |
|---|---|---|
| 2011/0069030 A1* | 3/2011 | Nozawa .................. 345/173 |
| 2011/0205180 A1 | 8/2011 | Han et al. |
| 2011/0221699 A1 | 9/2011 | Kim |
| 2011/0279394 A1 | 11/2011 | Kim |
| 2012/0044181 A1 | 2/2012 | Kim et al. |
| 2012/0050195 A1 | 3/2012 | Heo et al. |
| 2012/0062485 A1 | 3/2012 | Kim |

FOREIGN PATENT DOCUMENTS

| | | |
|---|---|---|
| KR | 1020030063656 A | 7/2003 |
| KR | 100480162 B1 | 3/2005 |
| KR | 100968221 B1 | 3/2009 |
| KR | 1020100067236 A | 6/2010 |
| KR | 1020110120121 A | 11/2011 |
| KR | 1020120001293 A | 1/2012 |
| KR | 101133967 B1 | 3/2012 |

* cited by examiner

LIQUID CRYSTAL DISPLAY AND MANUFACTURING METHOD THEREOF

This application claims priority to Korean Patent Application No. 10-2012-0083359 filed on Jul. 30, 2012, and all the benefits accruing therefrom under 35 U.S.C. §119, the content of which in its entirety is herein incorporated by reference.

BACKGROUND (a) Field

Exemplary embodiments of the invention relate to a liquid crystal display and a manufacturing method thereof, and in detail, to a liquid crystal display including a touch sensor and a manufacturing method thereof.

(b) Description of the Related Art

A liquid crystal display ("LCD"), which is one of the most widely used types of flat panel display, typically includes two display panels provided with field generating electrodes such as pixel electrodes and an opposing electrode, and a liquid crystal layer interposed between the two display panels. The LCD displays images by applying voltages to the field-generating electrodes to generate an electric field in the liquid crystal ("LC") layer that determines the orientation of LC molecules therein to adjust polarization of incident light.

In a conventional LCD, two substrates are generally included, and constituent elements are respectively disposed on the two substrates. Recently, an LCD including only one substrate has been developed such that the manufacturing cost may be reduced and the manufacturing process may be simplified.

The flat panel displays including the LCD perform functions using various input devices. Recently, a touch panel has been widely used as an input device.

The touch panel may allow a device such as a computer to perform various commands by writing a character, drawing a picture or executing an icon through a touch by a finger or a touch pen (or a stylus) on a screen. A display device, to which the touch panel is attached, may determine whether an object, e.g., a finger of a user or a touch pen, touches a screen and generate touch position information thereof. The touch panel is typically classified into a resistive type, a capacitive type, and an electro-magnetic ("EM") type based on the sensing method of the touch.

This touch panel may be attached on the upper substrate or the flat layer of the flat panel display such as the LCD or may be implemented in the LCD.

SUMMARY

Exemplary embodiments of the invention provide a liquid crystal display including a touch sensor, and a manufacturing process of the liquid crystal display including the touch sensor.

An exemplary embodiment of a manufacturing method of a liquid crystal display according to the invention includes: providing a thin film transistor on a substrate; providing a pixel electrode connected to the thin film transistor; providing a microcavity layer including a liquid crystal material on the pixel electrode; providing a supporting member layer on the microcavity layer; patterning the supporting member layer to form a plurality of recess portions therein; and providing a plurality of touch signal lines for transmitting a touch signal in the plurality of recess portions.

In an exemplary embodiment, the method may further include providing an insulating layer on the plurality of touch signal lines.

In an exemplary embodiment, the providing the insulating layer may include providing a first insulating layer, where the first insulating layer covers the plurality of touch signal lines and exposes at least a portion of a terminal of the plurality of touch signal lines.

In an exemplary embodiment, the method may further include providing a plurality of transparent conductive layers connected to the plurality of touch signal lines.

In an exemplary embodiment, the method may further include providing a plurality of connecting islands in the plurality of recess portions, where the providing the insulating layer may include providing a second insulating layer on the connecting islands, and the providing a plurality of transparent conductive layers may include providing a first transparent conductive layer including a plurality of portions connected to each other through the plurality of connecting islands.

In an exemplary embodiment, the providing the plurality of transparent conductive layers may further include providing a second transparent conductive layer, where the first transparent conductive layer and the second transparent conductive layer collectively define a touch sensor, and the second transparent conductive layer may be insulated from the connecting islands via the second insulating layer.

In an exemplary embodiment, the method may further include providing a signal line connected to the thin film transistor on the substrate, where the signal line includes a pad portion, and the providing the first insulating layer further may include forming a contact hole which exposes the pad portion by patterning the first insulating layer.

In an exemplary embodiment, the providing the plurality of transparent conductive layers may further include providing a contact assistant connected to the pad portion through the contact hole.

In an exemplary embodiment, the method may further include providing a signal line connected to the thin film transistor on the substrate, where the signal line includes a pad portion, and the providing the pixel electrode may include providing a contact assistant connected to the pad portion.

In an exemplary embodiment, the method may further include providing a capping layer on the plurality of transparent conductive layers, where the providing the capping layer may include exposing the contact assistant.

In an exemplary embodiment, the method may further include ashing the supporting member layer.

An exemplary embodiment of a liquid crystal display according to the invention includes: a substrate; a thin film transistor disposed on the substrate; a pixel electrode connected to a terminal of the thin film transistor; a microcavity layer disposed on the pixel electrode, where the microcavity layer includes a liquid crystal material; a supporting member disposed on the microcavity layer, where the supporting member includes a plurality of recess portions; and a plurality of touch signal lines disposed in the plurality of recess portions and which transmits a touch signal.

In an exemplary embodiment, the liquid crystal display may further include a first insulating layer disposed on the plurality of touch signal lines.

In an exemplary embodiment, the plurality of touch signal lines may include a terminal, at least a portion of which is exposed by the first insulating layer.

In an exemplary embodiment, the liquid crystal display may further include a plurality of transparent conductive layers connected to the plurality of touch signal lines.

In an exemplary embodiment, the liquid crystal display may further include a plurality of connecting islands disposed in the plurality of recess portions and a second insulating layer disposed on the connecting islands, where the plurality of transparent conductive layers may include a first transparent conductive layer including a plurality of portions connected to each other through the plurality of connecting islands.

In an exemplary embodiment, the plurality of transparent conductive layers may further include a second transparent conductive layer, where the first and second transparent conductive layers collectively define a touch sensor, and the second transparent conductive layer may be insulated from the connecting islands via the second insulating layer.

In an exemplary embodiment, the liquid crystal display may further include a signal line disposed on the substrate and connected to the thin film transistor, and a contact assistant connected to the signal line, where the signal line may include a pad portion disposed at an end thereof, the first insulating layer may include a contact hole which exposes the pad portion, and the contact assistant connected to the pad portion through the contact hole.

In an exemplary embodiment, the liquid crystal display may further include a signal line disposed on the substrate and connected to the thin film transistor, and a contact assistant connected to the signal line, where the signal line may include a pad portion disposed at an end thereof, and the contact assistant is disposed in a same layer as the pixel electrode and connected to the pad portion.

According to one or more exemplary embodiment of the invention, the manufacturing process of the liquid crystal display including the touch sensor is substantially simplified and the manufacturing cost is substantially reduced.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
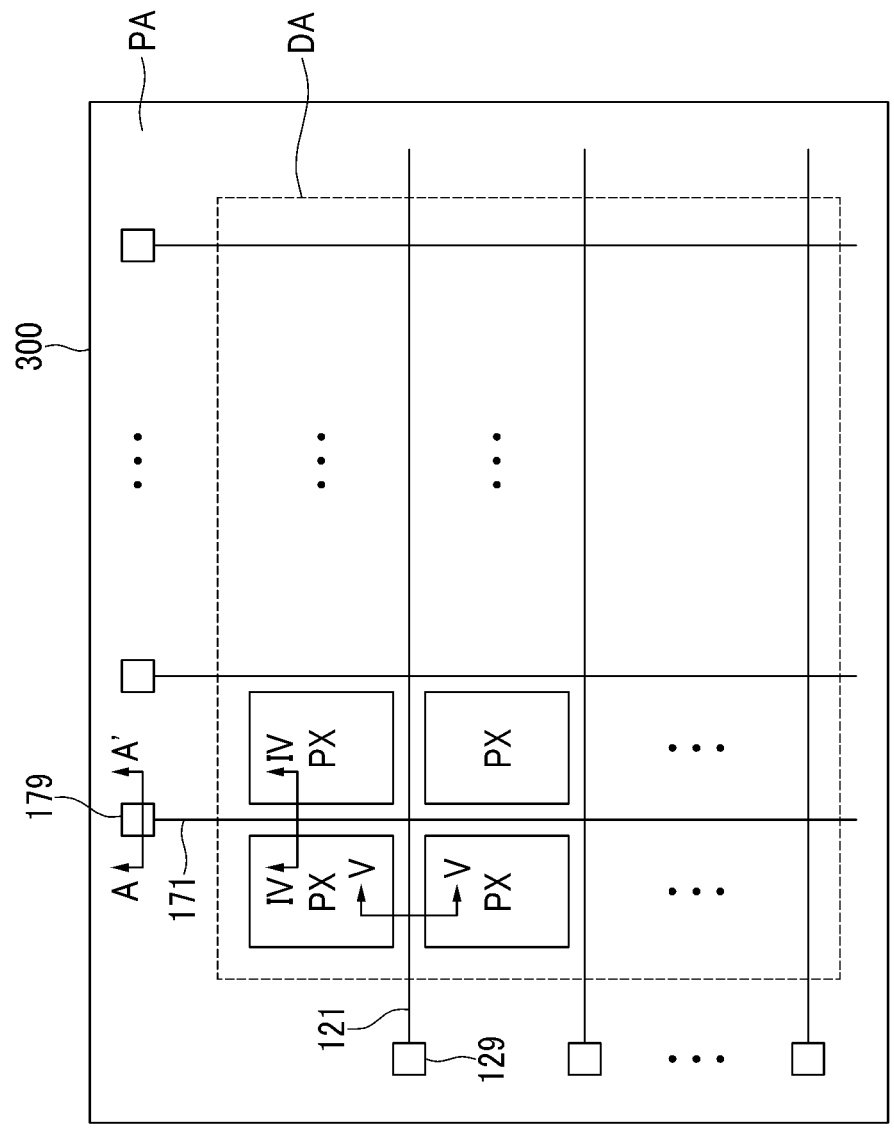
FIG. 1 is a block diagram showing an exemplary embodiment of a liquid crystal display according to the invention.

The invention will be described more fully hereinafter with reference to the accompanying drawings, in which exemplary embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments according to the invention will be described with reference to the accompanying drawings.

Firstly, an exemplary embodiment of a liquid crystal display according to the invention will be described with reference to FIG. 1 and FIG. 2.

Figure 2:
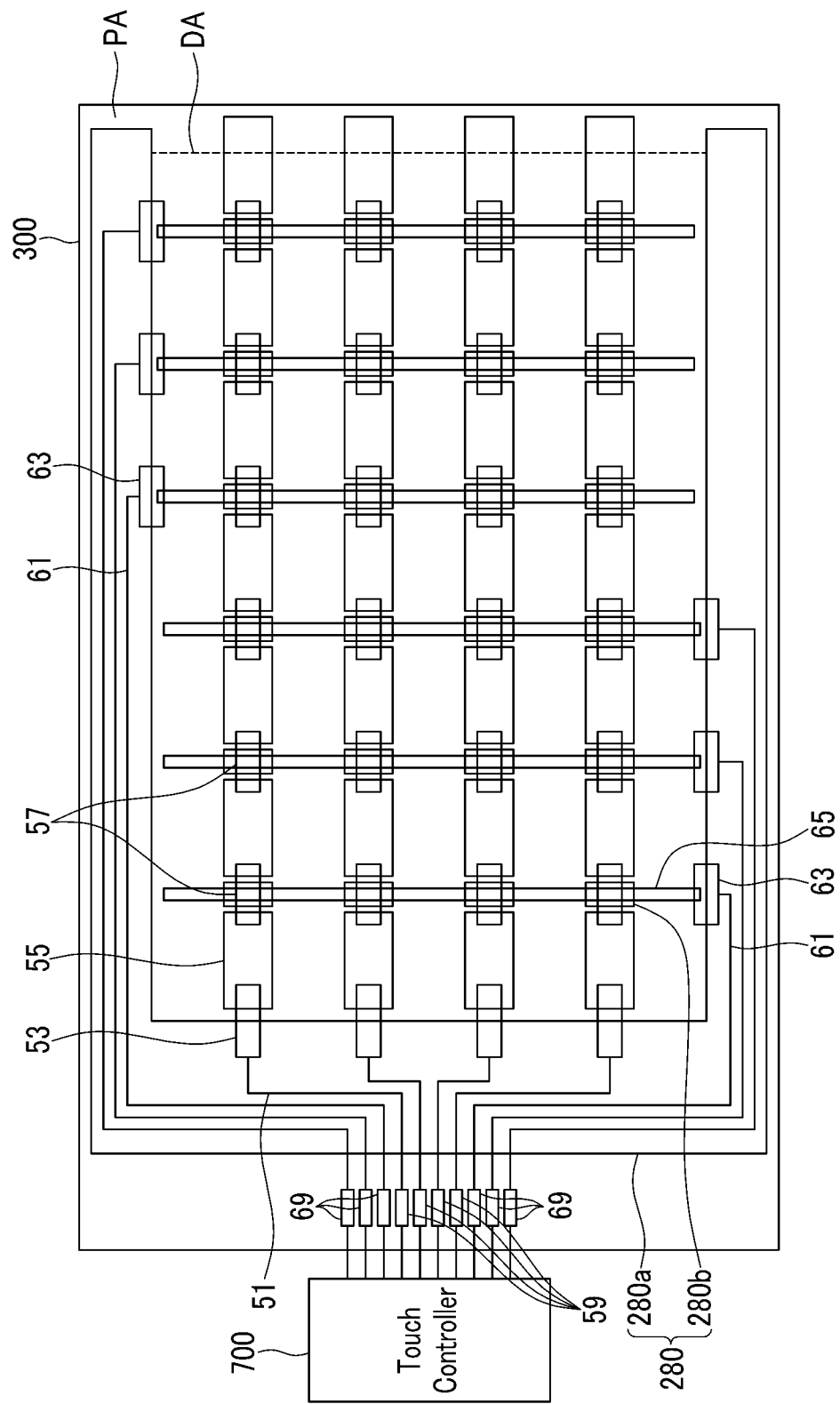
FIG. 2 is a block diagram showing an exemplary embodiment of a liquid crystal display according to the invention.

FIG. 1 is a block diagram showing an exemplary embodiment of a liquid crystal display according to the invention, and FIG. 2 is a block diagram showing an exemplary embodiment of a liquid crystal display according to the invention.

Referring to FIG. 1 and FIG. 2, an exemplary embodiment of a liquid crystal display according to the invention includes a display panel 300 including a plurality of pixels PX and a touch controller 700.

The display panel 300 includes a display area DA for displaying an image and a peripheral area PA surrounding at least a portion of the display area DA.

In an exemplary embodiment, a plurality of gate lines 121, a plurality of data lines 171, and a plurality of pixels PX connected to the gate lines 121 and the data lines 171 are disposed in the display area DA.

The gate lines 121 transfer a gate signal, and extend substantially in a row direction to be substantially parallel to each other. Each gate line 121 may include a pad portion 129 for connection with a gate driver (not shown). When the gate driver is provided, e.g., integrated, on the display panel 300, the pad portion 129 of each gate line 121 may be directly connected to the gate driver. The pad portion 129 may be disposed in the peripheral area PA.

The data lines 171 transmit the data voltage corresponding to the image signal and extend substantially in a column direction to be substantially parallel to each other. Each data line 171 may include a pad portion 179 for connection with a data driver (not shown). When the data driver is integrated on the display panel 300, the pad portion 179 of the data line 171 may be directly connected to the data driver. The pad portion 179 may be disposed, e.g., positioned, in the peripheral area PA.

The pixels PX are arranged substantially in a matrix form. Each pixel PX may include a switching element (not shown) connected to a corresponding gate line 121 and a corresponding data line 171, and a pixel electrode (not shown) connected to the corresponding gate and data lines 121 and 171. The switching element may be a three-terminal element such as a thin film transistor, which may be integrated on the display panel 300. The switching element is turned on or turned off in response to the gate signal of the gate line 121, thereby selectively transmitting the data signal from the data line 171 to the pixel electrode.

Referring to FIG. 2, a first touch signal line 51 and a second touch signal line 61 are disposed in the peripheral area PA of the display panel 300, and a first transparent conductive layer 55 and a second transparent conductive layer 65 are disposed in the display area DA.

The first touch signal line 51 receives a touch input signal from the touch controller 700 and transmits the touch input signal to the first transparent conductive layer 55.

The first touch signal line 51 is connected to a first pad portion 59 for transmitting the touch input signal from the touch controller 700, and includes a terminal 53 to transmit the touch input signal to the first transparent conductive layer 55. The first pad portion 59 may be disposed substantially close to a first edge of the display panel 300 at the side where the touch controller 700 is disposed. The terminal 53 of the first touch signal line 51 may be arranged along a direction substantially parallel to the first edge. In one exemplary embodiment, as shown in FIG. 2, for example, the first edge extends in the column direction.

The second touch signal line 61 receives a touch output signal from the second transparent conductive layer 65 and transmits the touch output signal to the touch controller 700.

The second touch signal line 61 includes a terminal 63 for receiving the touch output signal from the second transparent conductive layer 65, and may transmit the touch output signal to the touch controller 700 through a second pad portion 69. The second pad portion 69 may be disposed substantially close to the first edge of the display panel 300 at the side, where the touch controller 700 is disposed, along with the first pad portion 59 of the first touch signal line 51. The terminal 63 of the second touch signal line 61 may include a terminal 63 disposed at a first side, e.g., an upper side, of the display area DA and a terminal 63 disposed at a second side, e.g., a lower side, opposite to the first side. The terminal 63 disposed at to the first or second side of the display area DA may be arranged along a direction substantially perpendicular to the first edge.

The first touch signal line 51 including the terminal 53 thereof and the second touch signal line 61 including the terminal 63 thereof may include a conductive material, e.g., metal, and may be disposed in a same layer and provided together in a same process.

According to an alternative exemplary embodiment of the invention, the terminal 63 of the second touch signal line 61 may be disposed in only one side of the display area DA.

According to another alternative exemplary embodiment of the invention, the functions of the first touch signal line 51 and the second touch signal line 61 may be exchanged. In one exemplary embodiment, for example, the second touch signal line 61 receives the touch input signal from the touch controller 700 and transmits the touch input signal to the second transparent conductive layer 65, and the first touch signal line 51 receives the touch output signal from the first transparent conductive layer 55 and transmits the touch output signal to the touch controller 700.

In an exemplary embodiment, an insulating layer 280 is disposed on the first touch signal line 51 and the second touch signal line 61. The insulating layer 280 may include a first insulating layer 280a disposed in the peripheral area PA of the display panel 300 and a second insulating layer 280b disposed in the display area DA.

The first insulating layer 280a covers the first touch signal line 51 and the second touch signal line 61 such that the first touch signal line 51 and the second touch signal line 61 is effectively protected. The second insulating layer 280b may include a plurality of islands.

The insulating layer 280 may expose at least a portion of the terminal 53 of the first touch signal line 51 and at least a portion of the terminal 63 of the second touch signal line 61.

The insulating layer 280 may include an inorganic insulator such as silicon nitride (SiNx) and silicon oxide (SiOx), for example.

The first transparent conductive layer 55 and the second transparent conductive layer 65 may be disposed on the insulating layer 280.

First transparent conductive layer 55 may extend substantially in the row direction and include a plurality of portions disposed substantially parallel to each other. The first transparent conductive layer 55 is electrically connected to the terminal 53 of the first touch signal line 51, such that the first transparent conductive layer 55 receives the touch input signal from the touch controller 700 through the terminal 53 and outputs the touch output signal. The touch input signal and the touch output signal will be collectively referred to as a touch signal.

In an exemplary embodiment, the portions of the first transparent conductive layer 55, which are disposed in a same line, are spaced apart from each other, as shown in FIG. 2. Neighboring portions of the first transparent conductive layer 55 may be electrically connected to each other through a connecting member. The connecting member may include a connecting island 57.

The connecting island 57 may overlap the second insulating layer 280b. In an exemplary embodiment, a pair of edges of the connecting island 57 facing each other, e.g., a pair of edges facing each other in the column direction, may be covered by the second insulating layer 280b. At least a portion of the connecting island 57 may be exposed by the insulating layer 280. In an exemplary embodiment, each connecting island 57 may include exposed end portions at opposing sides thereof with reference to the second insulating layer 280b.

The connecting island 57 may be provided in the same process as the first touch signal line 51 and the second touch signal line 61, and the connecting island 57 may include the same material as the first touch signal line 51 and the second touch signal line 61.

Second transparent conductive layer 65 may extend substantially in the column direction and include a plurality of portions disposed substantially parallel to each other. The second transparent conductive layer 65 is electrically connected to the terminal 63 of the second touch signal line 61, such that the second transparent conductive layer 65 receives the touch input signal from the touch controller 700 through the terminal 63 and outputs the touch output signal.

In an exemplary embodiment, each of the portions of the second transparent conductive layer 65 may be integrally formed as a single unitary and indivisible unit, as shown in FIG. 2.

The second insulating layer 280b is disposed between the first transparent conductive layer 55 and the second transparent conductive layer 65, thereby insulating the first transparent conductive layer 55 and the second transparent conductive layer 65. In an exemplary embodiment, as shown in FIG. 2, the second transparent conductive layer 65 extends overlapping the second insulating layer 280b on the connecting island 57 and in the column direction.

The first transparent conductive layer 55, the second transparent conductive layer 65, the first pad portion 59 and the second pad portion 69, include a transparent conductive material such as indium tin oxide ("ITO") or indium zinc oxide ("IZO"). In an exemplary embodiment, the first transparent conductive layer 55, the second transparent conductive layer 65, the first pad portion 59 and the second pad portion 69 may include a same material and provided in a same process.

According to an alternative exemplary embodiment of the invention, the structures of the first transparent conductive layer 55 and the second transparent conductive layer 65 may be exchanged. In such an embodiment, the first transparent conductive layer 55 may be integrally formed as a single unitary and indivisible unit, and the second transparent conductive layer 65 may include a plurality of portions that are spaced apart from each other and electrically connected through the connecting member.

According to another alternative exemplary embodiment of the invention, the first transparent conductive layer 55 and the second transparent conductive layer 65 may be disposed in different layers via the second insulating layer 280b. In such an embodiment, each of the first transparent conductive layer 55 and the second transparent conductive layer 65 may be integrally formed as a single unitary and indivisible unit extending substantially in the row direction or the column direction.

According to another alternative exemplary embodiment of the invention, the second insulating layer 280b between the first transparent conductive layer 55 and the second transparent conductive layer 65 may include a fluent insulating material and a spacer. In such an embodiment, the second insulating layer 280b may maintain an interval between the first transparent conductive layer 55 and the second transparent conductive layer 65. Such a structure may be applied to a resistive type of touch sensor.

In an exemplar embodiment of the liquid crystal display according to the invention, the first transparent conductive layer 55 and the second transparent conductive layer 65 collectively form a resistive type of touch sensor or a capacitive type of touch sensor, thereby sensing an external contact thereon.

In an exemplary embodiment, where the touch sensor is the capacitive type, a sensing capacitor may be defined at portions where the first transparent conductive layer 55 and the second transparent conductive layer 65 overlap or are substantially close to each other. The touch sensor including the sensing capacitor receives the touch input signal input from the touch controller 700 and then outputs the touch output signal corresponding to the change of the charge amount of the sensing capacitor by the contact of the external object.

In an alternative exemplary embodiment, where the touch sensor is the resistive type, the fluent second insulating layer 280*b* maintains the interval between the first transparent conductive layer 55 and the second transparent conductive layer 65 in absence of contact, and the second transparent conductive layer 65 physically contacts the first transparent conductive layer 55 by the external contact. In such an embodiment, the first transparent conductive layer 55 or the second transparent conductive layer 65, which receives the touch input signal, outputs the touch output signal corresponding to the voltage that is changed based on the resistance of the contact position.

The touch controller 700 processes the touch output signal output from the first transparent conductive layer 55 or the second transparent conductive layer 65 to determine the contact existence and the contact position of the display panel 300.

Next, a structure of an exemplary embodiment of the liquid crystal display including the touch sensor according to the invention will be described with reference to FIG. 3 to FIG. 5. The same or like elements shown in FIGS. 3 to 5 have been labeled with the same reference characters as used above to describe the exemplary embodiments of the liquid crystal display shown in FIGS. 1 and 2, and any repetitive detailed description thereof will hereinafter be omitted or simplified.

Figure 3:
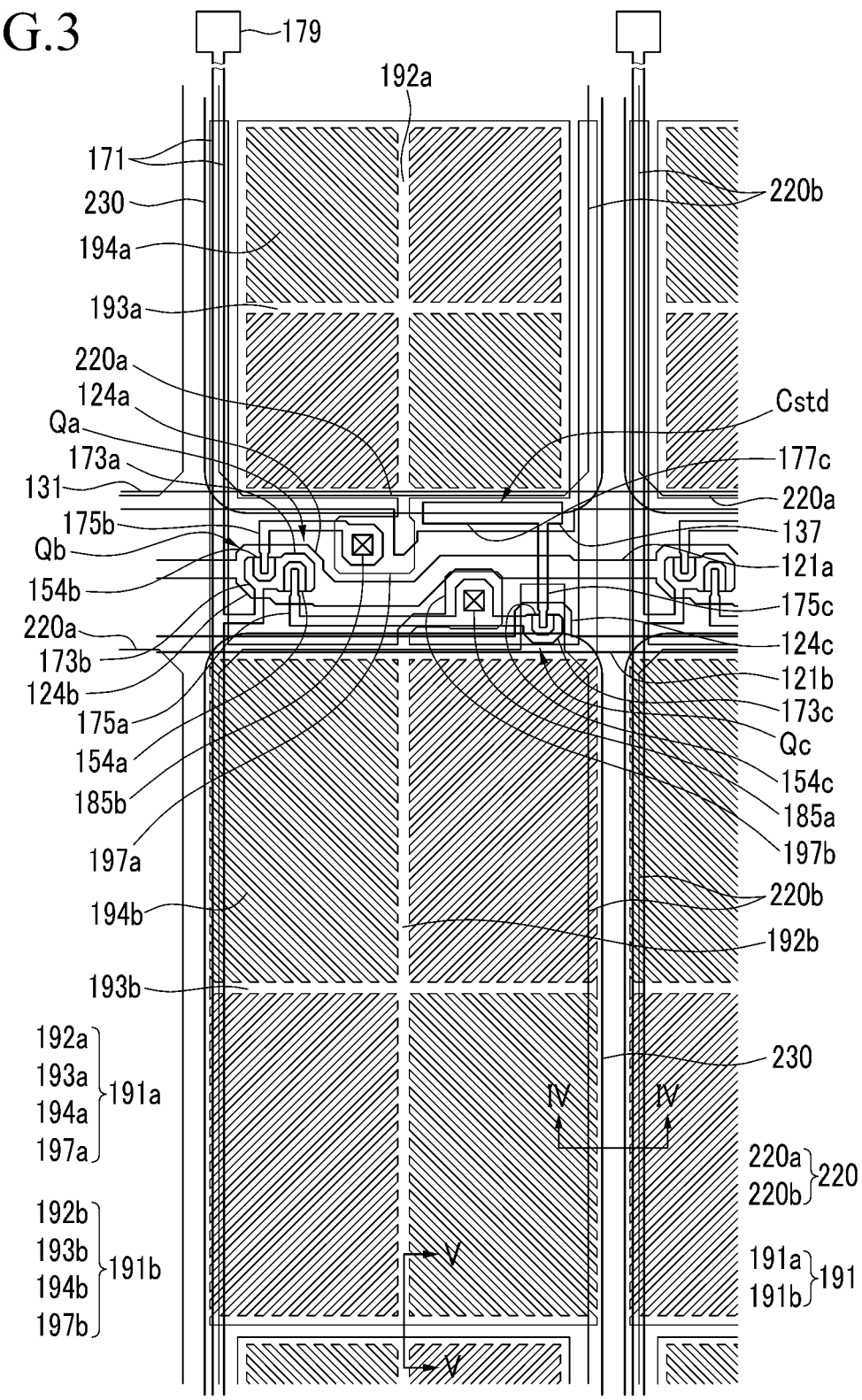
FIG. 3 is a top plan view of one pixel of a liquid crystal display according to an exemplary embodiment of the invention.
Figure 4:
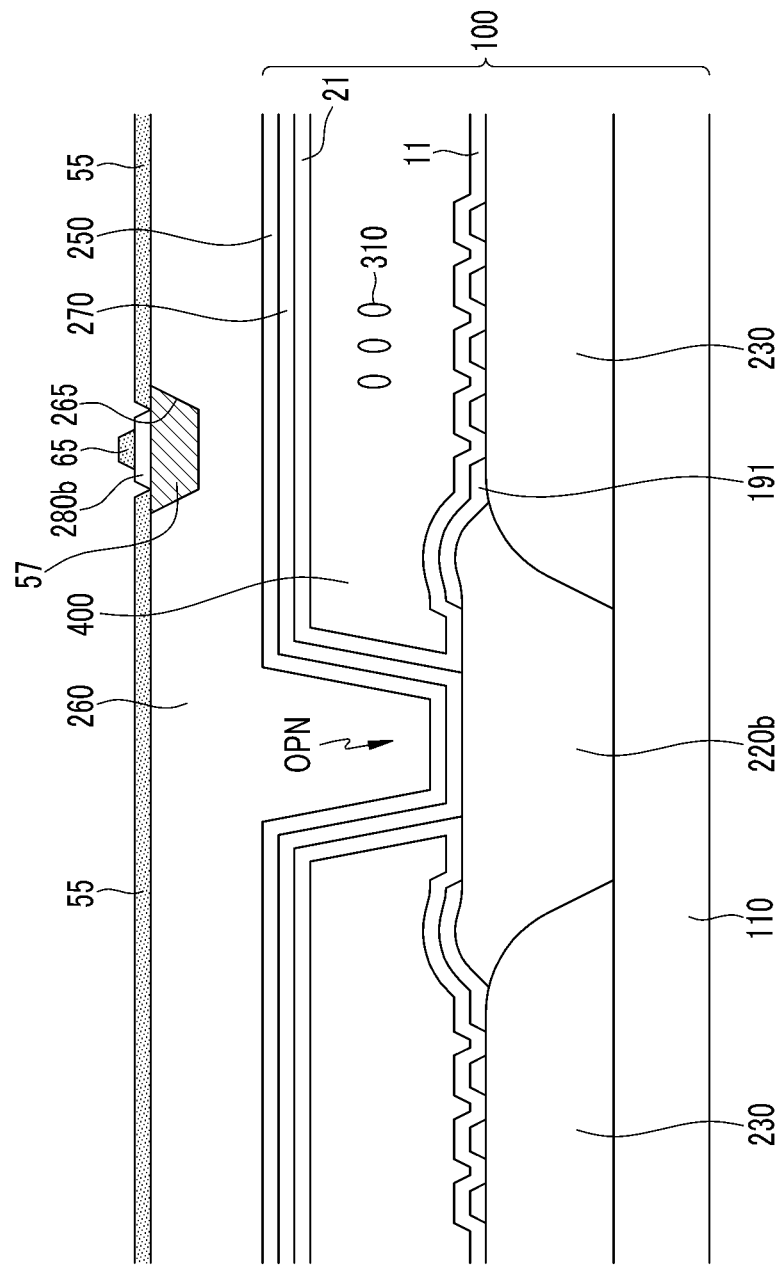
FIG. 4 is a cross-sectional view taken along line IV-IV of an exemplary embodiment of the liquid crystal display shown in FIG. 1 and FIG. 3.
Figure 5:
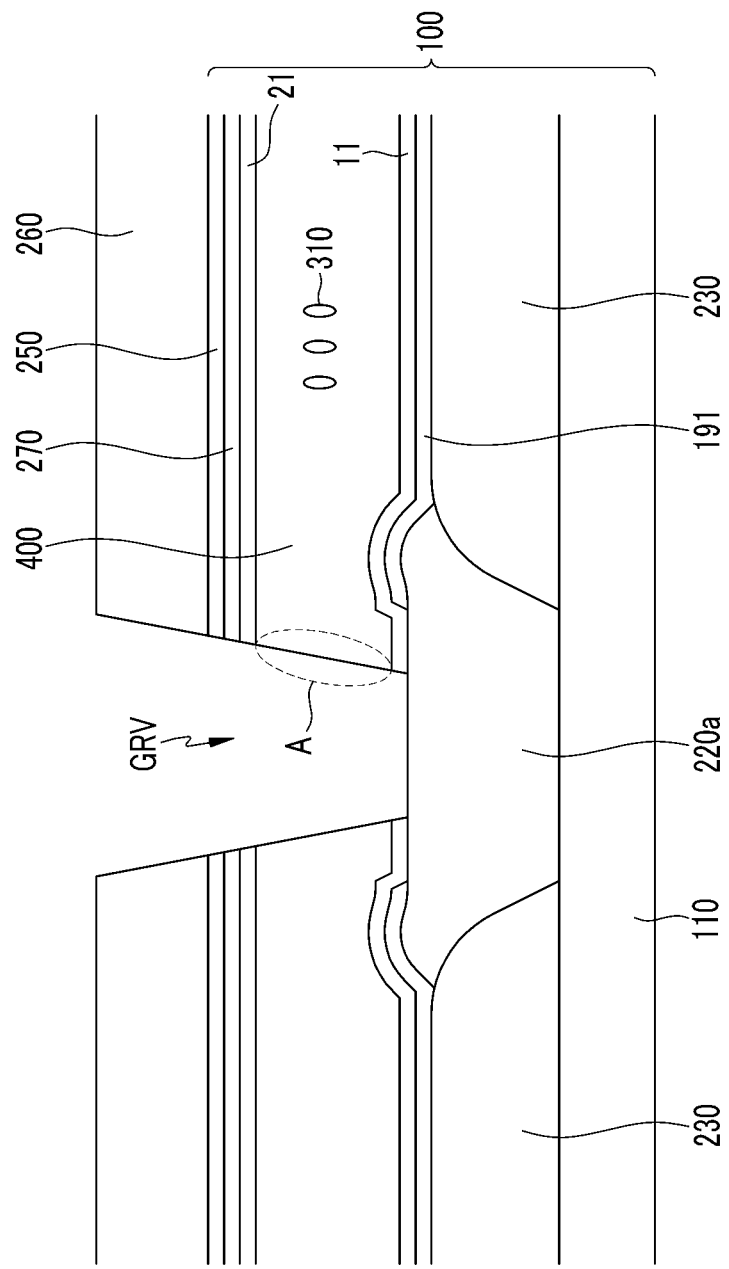
FIG. 5 is a cross-sectional view taken along line V-V of an exemplary embodiment of the liquid crystal display shown in FIG. 1 and FIG. 3.

FIG. 3 is a top plan view of one pixel of an exemplary embodiment of a liquid crystal display according to the invention, FIG. 4 is a cross-sectional view taken along line IV-IV of the liquid crystal display shown in FIG. 1 and FIG. 3, and FIG. 5 is a cross-sectional view taken along line V-V of the liquid crystal display shown in FIG. 1 and FIG. 3.

Referring to FIG. 3 to FIG. 5, which show a schematic deposition structure of an exemplary embodiment of the liquid crystal display according to the invention, thin film transistors, e.g., a first thin film transistor Qa, a second thin film transistor Qb and a third thin film transistor Qc, are disposed on a substrate 110 including transparent glass or plastic. A passivation layer (not shown) may be disposed on the thin film transistors Qa, Qb and Qc, and a color filter 230 and a light blocking member 220, e.g., first and second light blocking members 220*a* and 220*b*, may be disposed on the passivation layer. A pixel electrode 191 may be disposed on the color filter 230 and the light blocking member 220. The pixel electrode 191 is electrically connected to terminals of the first and second thin film transistors Qa and Qb through contact holes 185*a* and 185*b* of the passivation layer that exposes the terminals of the first and second thin film transistors Qa and Qb.

In FIG. 3 and FIG. 4, for convenience of illustration, constitutions between the substrate 110 and the color filter 230, for example, partial constitutions of the thin film transistors Qa, Qb and Qc, are omitted.

Color filters 230 may extend along a column of the pixel electrode 191. Each of the color filters 230 may display one of primary colors such as three primary colors of the red, green and blue, for example. However, it is not limited to three primary colors such as red, green and blue. In an alternative exemplary embodiment, each of the color filters 230 may display one of cyan, magenta, yellow and white-based colors.

A lower alignment layer 11 is disposed on the pixel electrode 191.

A microcavity layer 400 is disposed on the lower alignment layer 11. In an exemplary embodiment, the microcavity layer 400 has a liquid crystal injection hole A, and the microcavity layer 400 may be provided by injecting a liquid crystal material including liquid crystal molecules 310 through the liquid crystal injection hole A. The microcavity layer 400 may be disposed along a column direction of the pixel electrode 191, that is, in a vertical direction. In an exemplary embodiment, the liquid crystal material may be injected to the microcavity layer 400 using a capillary force.

An upper alignment layer 21 is disposed on the microcavity layer 200, and an opposing electrode 270 and an overcoat 250 are disposed on the upper alignment layer 21.

The opposing electrode 270, which receives a common voltage, generates an electric field along with the pixel electrode 191 applied with the data voltage to determine an inclination direction of the liquid crystal molecules 310 in the microcavity layer 400 between the opposing and pixel electrodes 270 and 191.

The overcoat 250 may include silicon nitride (SiNx) or silicon oxide ($SiO_2$), for example.

The deposited portions from the substrate 110 to the overcoat 250 will now be referred to as a display panel unit 100.

A supporting member 260 is disposed on the display panel unit 100. The supporting member 260 may include silicon oxycarbide (SiOC), a photoresist, or an organic material, for example. In an exemplary embodiment, where the supporting member 260 includes silicon oxycarbide (SiOC), a chemical vapor deposition method may be used to provide the supporting member 260. In an alternative exemplary embodiment, where the supporting member 260 includes the photoresist, a coating method may be used to provide the supporting member 260.

In an exemplary embodiment, a groove GRV, formed through the microcavity layer 400, the upper alignment layer 21, the opposing electrode 270, the overcoat 250 and the supporting member 260, may be defined between the neighboring pixels PX. In an alternative exemplary embodiment, the groove GRV may be defined in the region where the thin film transistors Qa, Qb and Qc are disposed.

The microcavity layer 400 is divided into a plurality of portions by a plurality of grooves GRV, and the micro activity layer 400 may be disposed along the row direction. The portions of the microcavity layer 400 may respectively correspond to the pixels PX. The groove GRV between the microcavity layers 400 may be formed along the row direction.

The liquid crystal injection hole A of the microcavity layer 400 may be defined at a region corresponding to the boundary between the groove GRV and the microcavity layer 400.

An open portion OPN is defined between the portions of the microcavity layer 400 neighboring each other in the row direction and defined between the pixels PX neighboring each other in the row direction, and the open portion OPN may be covered by the supporting member 260.

The liquid crystal injection hole A is formed in the direction, in which the groove GRV extends. A width of the liquid crystal injection hole A between the supporting member 260 and the pixel electrode 191 is relatively wide, and a width of the liquid crystal injection hole A between the upper alignment layer 21 and the lower alignment layer 11 is relatively narrow.

According to an alternative exemplary embodiment of the invention, a plurality of grooves GRV may be defined along the column direction.

The deposition structure of an exemplary embodiment of the liquid crystal display according to the invention is not limited to the above-described structure and may be variously changed.

In an exemplary embodiment, the supporting member 260 includes a plurality of recess portions 265. The position of the recess portion 265 corresponds to the position of the first touch signal line 51, the second touch signal line 61 and the connecting island 57. In an exemplary embodiment, a bottom surface of the recess portion 265 may contact an upper surface of the overcoat 250. In an alternative exemplary embodiment, as shown in FIG. 4, the bottom surface of the recess portion 265 may be spaced apart from the upper surface of the overcoat 250.

The first touch signal line 51, the second touch signal line 61 and the connecting island 57 are disposed in the recess portion 265 of the supporting member 260. Levels of the upper surface of the first touch signal line 51, the second touch signal line 61 and the connecting island 57 may be substantially the same or higher than a level of the upper surface of the supporting member 260.

The insulating layer 280 including the first insulating layer 280a and the second insulating layer 280b is disposed on the first touch signal line 51, the second touch signal line 61 and the connecting island 57.

The first transparent conductive layer 55 and the second transparent conductive layer 65 are disposed on the supporting member 260 and the insulating layer 280.

In an exemplary embodiment, a capping layer (not shown) may be disposed on the first transparent conductive layer 55 and the second transparent conductive layer 65. The capping layer may contact the upper surface and the side surface of the supporting member 260. The capping layer may cover the liquid crystal injection hole A of the microcavity layer 400 exposed by the groove GRV.

In an exemplary embodiment, the liquid crystal material is injected through the liquid crystal injection hole A of the microcavity layer 200, thereby providing a liquid crystal display without additional formation of an upper substrate, which is typically included in a conventional liquid crystal display. In such an embodiment, the volume of the liquid crystal display is substantially reduced, the manufacturing process is substantially simplified, and the manufacturing cost is substantially reduced.

According to an exemplary embodiment of the invention, the touch panel to sense the touch is not additionally formed and is not attached to the liquid crystal display, but the first touch signal line 51 and the second touch signal line 61, for example, are formed in the recess portion 265 of the supporting member 260, and the first transparent conductive layer 55 and the second transparent conductive layer 65 which collectively define the touch sensor are provided thereon such that the manufacturing process of the liquid crystal display having the touch sensing function is substantially simplified and the manufacturing cost is thereby reduced. In such an embodiment, the volume and the weight of the liquid crystal display are substantially reduced.

Next, a detailed structure of one pixel of an exemplary embodiment of a liquid crystal display according to the invention will be described with reference to FIG. 1 to FIG. 3.

A plurality of gate conductors including a plurality of gate lines 121a, a plurality of step-down gate lines 121b and a plurality of storage electrode lines 131 are disposed on the substrate 110 including transparent glass or plastic, for example.

The gate lines 121a and the step-down gate lines 121b extend substantially in a horizontal direction and transmit gate signals. Each of the gate lines 121a includes a first gate electrode 124a and a second gate electrode 124b, and each of the step-down gate lines 121b includes a third gate electrode 124c. The first gate electrode 124a and the second gate electrode 124b are connected to each other and collectively form a protrusion.

The storage electrode lines 131 are extended substantially in the transverse direction, and transfer a predetermined voltage such as a common voltage.

A gate insulating layer (not shown) is disposed on the gate conductors.

A plurality of semiconductor stripes (not shown) that may include amorphous silicon or crystallized silicon is disposed on the gate insulating layer. The semiconductor stripes extend substantially in the vertical direction, and include first and second semiconductors 154a and 154b, which are protruding toward the first and second gate electrodes 124a and 124b and connected to each other, and a third semiconductor 154c disposed on the third gate electrode 124c.

A plurality of pairs of ohmic contacts (not shown) is disposed on the semiconductors 154a, 154b and 154c. The ohmic contacts may include silicide or of n+ hydrogenated amorphous silicon doped with an n-type impurity at a high concentration, for example.

A data conductor, including a plurality of data lines 171, a plurality of first drain electrodes 175a, a plurality of second drain electrodes 175b and a plurality of third drain electrodes 175c, is disposed on the ohmic contacts.

The data lines 171 transmit data signals and extend substantially in the vertical direction, thereby intersecting the gate line 121a and the step-down gate line 121b. Each data line 171 includes a first source electrode 173a and a second source electrode 173b, which are extending toward the first gate electrode 124a and the second gate electrode 124b, respectively, and connected to each other. Each data line 171 may include a pad portion 179 having a relatively wide width for connection with another layer or the data driver.

The first drain electrode 175a, the second drain electrode 175b and the third drain electrode 175c include a wide end and a bar-shaped end. The Bar-shaped ends of the first drain electrode 175a and the second drain electrode 175b are partially enclosed by the first source electrode 173a and the second source electrode 173b. The wide end of the first drain electrode 175a is connected to a third source electrode 173c having a U-liked shape. A wide end 177c of the third drain electrode 175c overlaps a capacitive electrode 137, thereby forming a step-down capacitor Cstd, and the bar-shaped end of the third drain electrode 175c is partially enclosed by the third source electrode 173c.

The first gate electrode 124a, the first source electrode 173a and the first drain electrode 175a collectively define a first thin film transistor Qa along with the first semiconductor 154a, the second gate electrode 124b, the second source electrode 173b and the second drain electrode 175b collectively define a second thin film transistor Qb along with the second semiconductor 154b, and the third gate electrode 124c, the third source electrode 173c and the third drain electrode 175c collectively define a third thin film transistor Qc along with the third semiconductor 154c.

The semiconductor stripes including the first semiconductor 154a, the second semiconductor 154b and the third semiconductor 154c except for the channel region between the source electrodes 173a, 173b and 173c, and the drain electrodes 175a, 175b, and 175c have substantially the same planar shape as the data conductors 171, 173a, 173b, 173c, 175a, 175b and 175c and the ohmic contacts disposed therebelow.

A lower passivation layer (not shown) including an inorganic insulator such as silicon nitride or silicon oxide is disposed on the data conductors 171, 173a, 173b, 173c, 175a, 175b and 175c and the exposed first, second and third semiconductors 154a, 154b and 154c.

The color filter 230 and the light blocking member 220 may be disposed on the lower passivation layer. The light blocking member 220 includes the first light blocking member 220a extending vertically along the gate line 121a and the step-down line 121b and covering the region at which the first thin film transistor Qa, the second thin film transistor Qb and the third thin film transistor Qc are disposed, and the second light blocking member 220b that extends along the data line 171.

The lower passivation layer and the light blocking member 220 have a plurality of contact holes 185a and 185b exposing the first drain electrode 175a and the second drain electrode 175b.

In an exemplary embodiment, a pixel electrode 191 including a first sub-pixel electrode 191a and a second sub-pixel electrode 191b is disposed on the color filter 230 and the light blocking member 220. The first sub-pixel electrode 191a and the second sub-pixel electrode 191b are divided with respect to the gate line 121a and the step-down gate line 121b, and are disposed below and above with respect to the gate line 121a and the step-down gate line 121b such that The first sub-pixel electrode 191a and the second sub-pixel electrode 191b are adjacent to each other in the column direction.

The first sub-pixel electrode 191a and the second sub-pixel electrode 191b respectively include a cross stem including transverse stems 193a and 193b and longitudinal stems 192a and 192b crossing the transverse stems 193a and 193b. The first sub-pixel electrode 191a and the second sub-pixel electrode 191b further respectively include a plurality of minute branches 194a and 194b and a plurality of protrusions 197a and 197b.

The pixel electrode 191 is divided into four sub-regions by the transverse stems 193a and 193b and the longitudinal stems 192a and 192b. The minute branches 194a and 194b obliquely extend from the transverse stems 193a and 193b and the longitudinal stems 192a and 192b, and the extending direction thereof forms an angle of about 45 degrees or about 135 degrees with the gate lines 121a and 121b or the transverse stems 193a and 193b. In such an embodiment, the minute branches 194a and 194b of two neighboring sub-regions may be substantially perpendicular to each other.

In an exemplary embodiment, as described above, the lower alignment layer 11, the microcavity layer 400, the upper alignment layer 21, the opposing electrode 270, the overcoat 250, the supporting member 260, the first and second touch signal lines 51 and 61, and the first and second transparent conductive layers 55 and 65 are disposed on the pixel electrode 191.

Next, an exemplary embodiment of a manufacturing method of the liquid crystal display including the touch sensor according to the invention will be described with reference to FIG. 6 to FIG. 14 as well as the above-described drawings.

Figure 6:
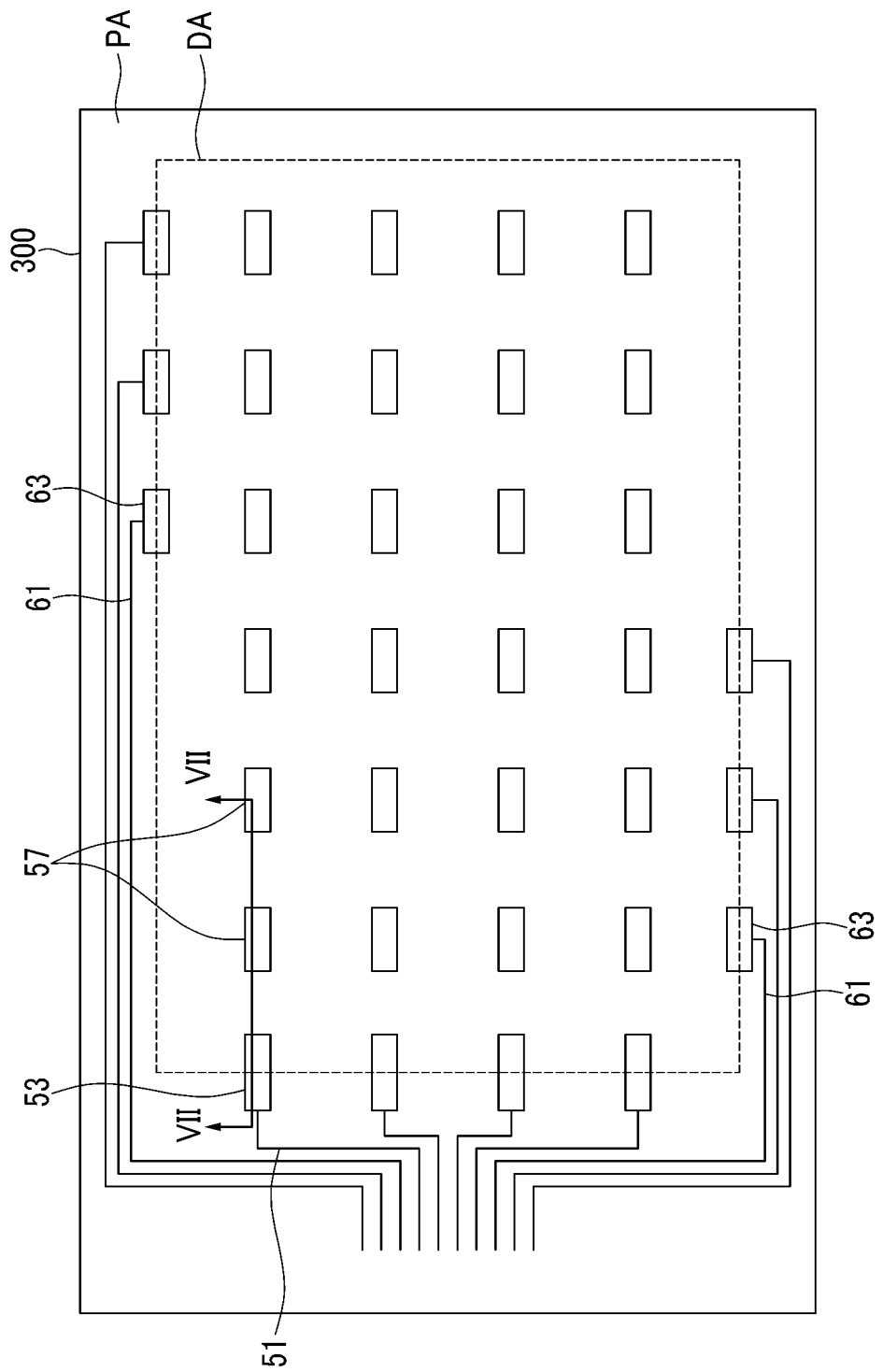
FIG. 6 is a block diagram showing an intermediate step of an exemplary embodiment of a method of manufacturing a liquid crystal display according to the invention.
Figure 7:
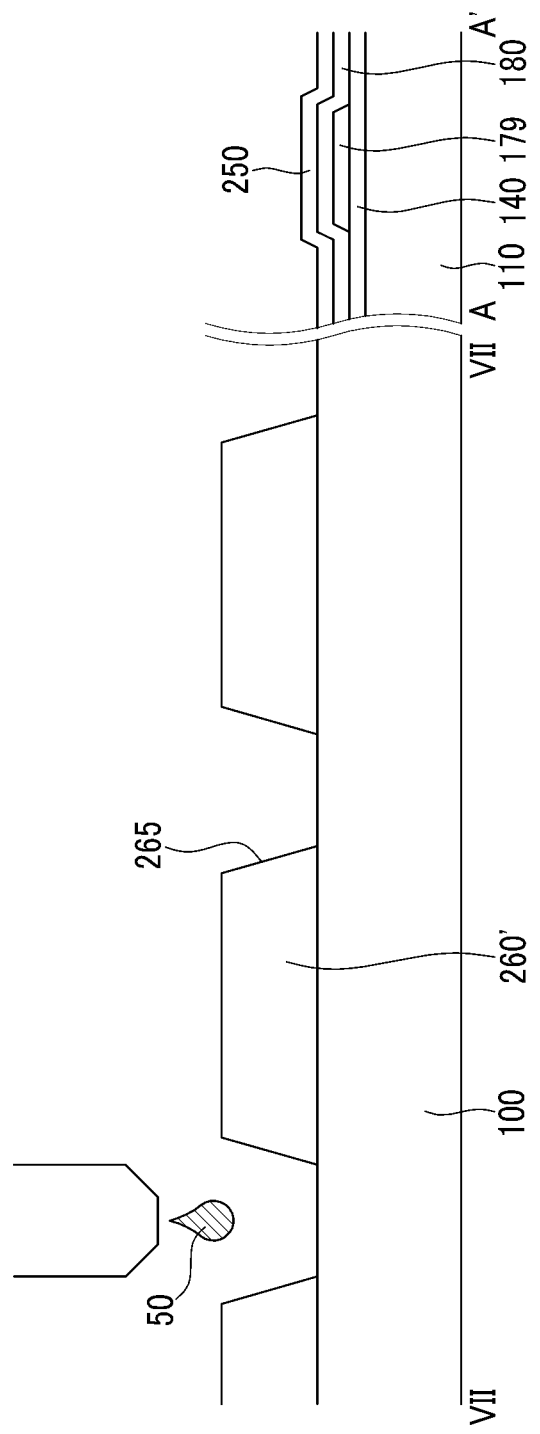
FIG. 7, FIG. 8, and FIG. 9 are cross-sectional views taken along line VII-VII of the liquid crystal display of FIG. 6 and taken along line A-A' of the liquid crystal display of FIG. 1 sequentially showing intermediate steps of an exemplary embodiment of a method of manufacturing a liquid crystal display according to the invention.
Figure 8:
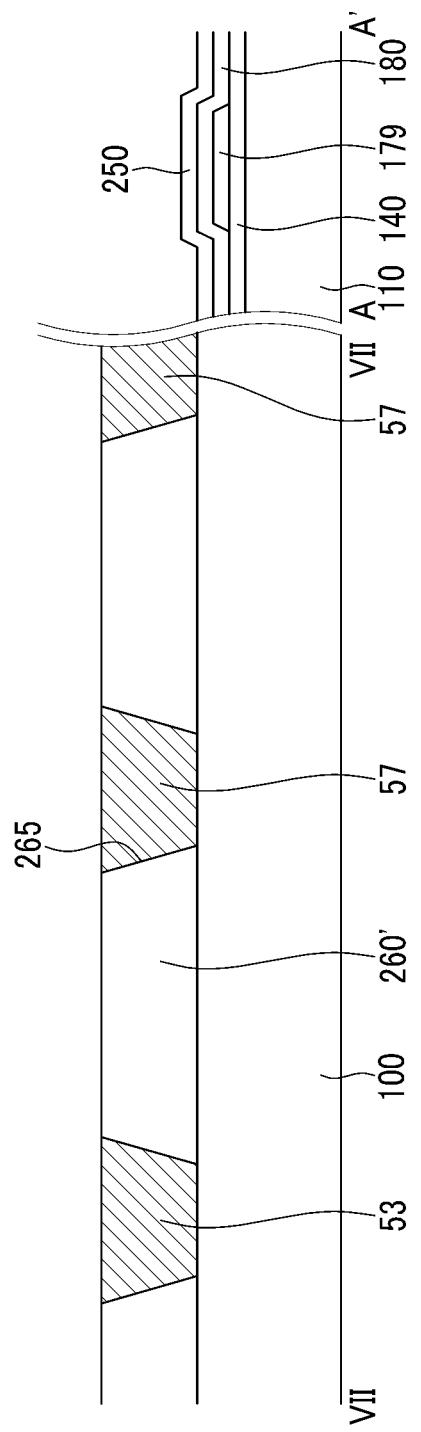
Figure 9:
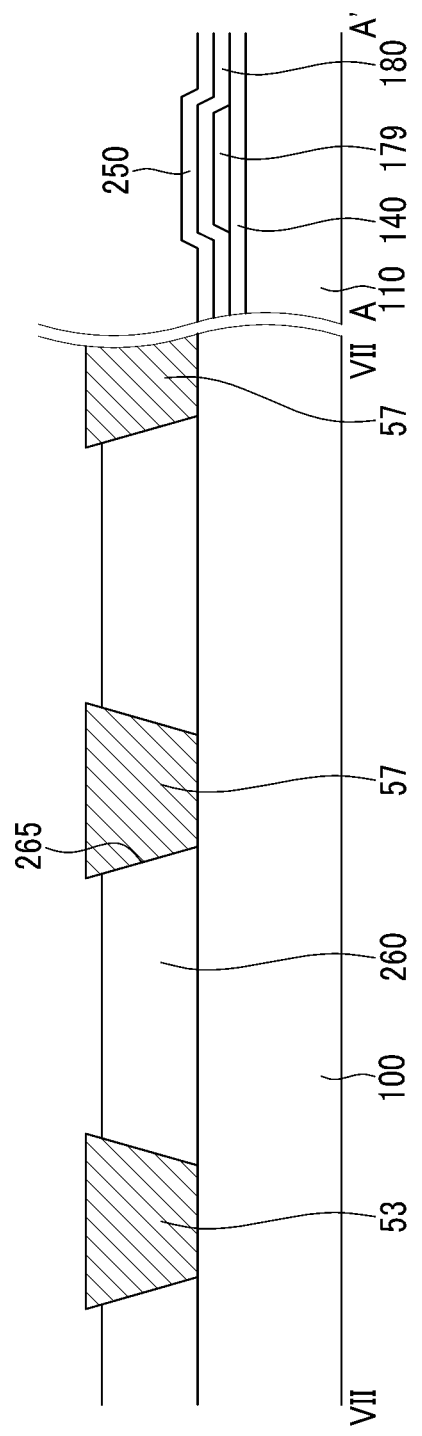
Figure 10:
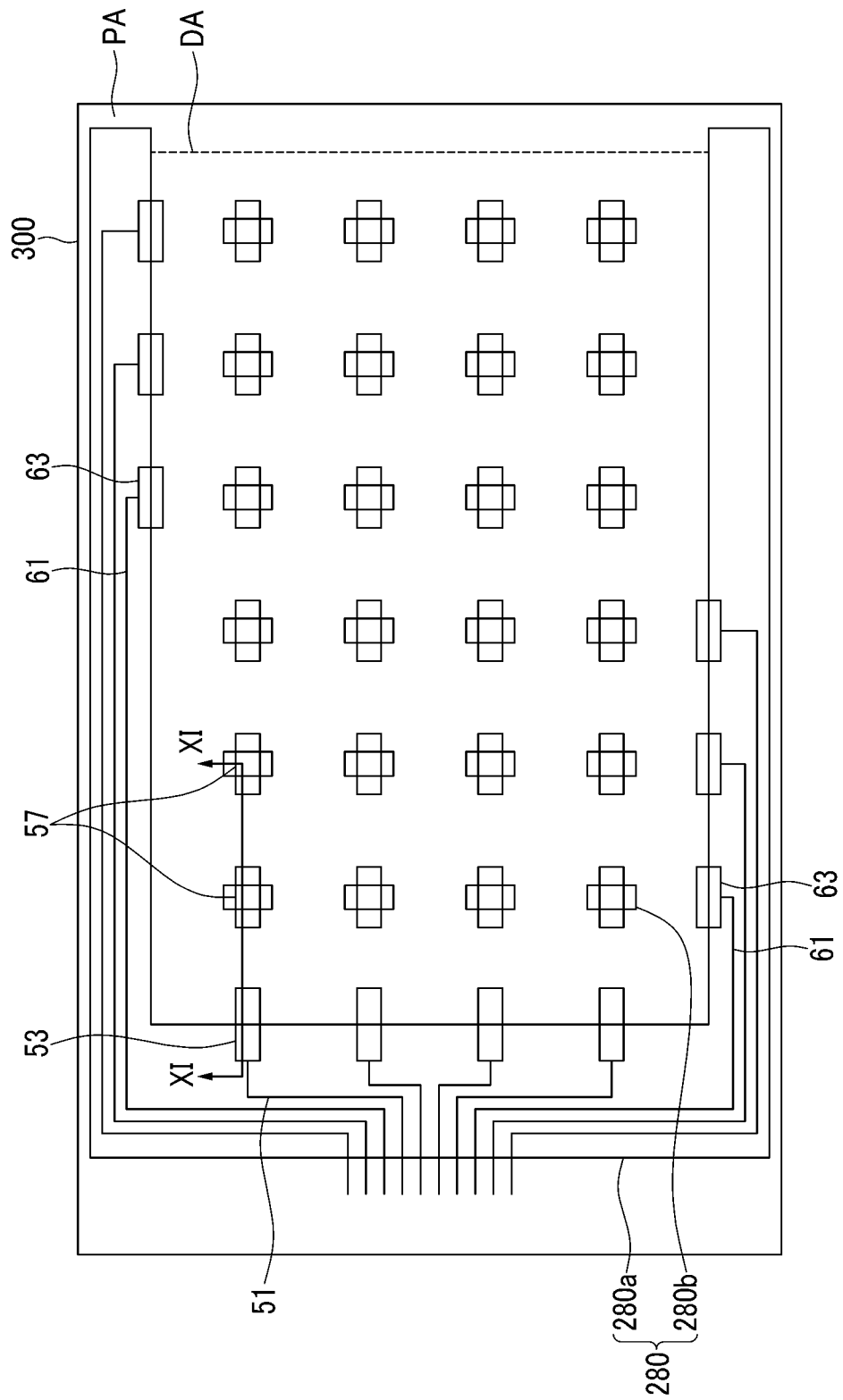
FIG. 10 is block diagram showing another intermediate step of an exemplary embodiment of a method of manufacturing a liquid crystal display according to the invention, which is a step following the step shown in FIG. 6.
Figure 11:
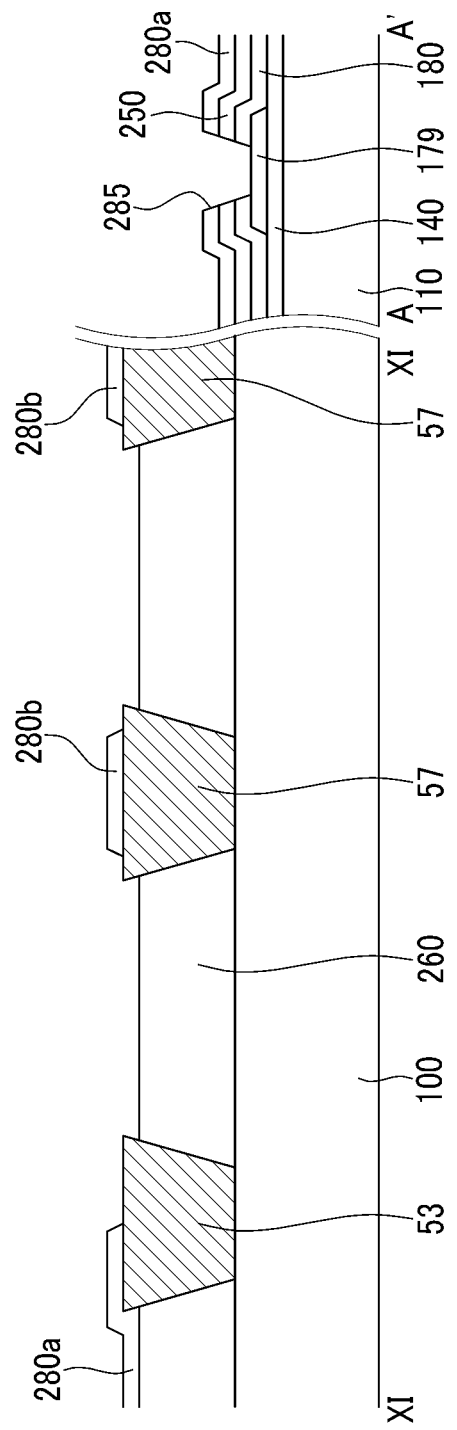
FIG. 11 is a cross-sectional view taken along line XI-XI of the liquid crystal display of FIG. 10 and taken along line A-A' of the liquid crystal display of FIG. 1 showing an intermediate step of an exemplary embodiment of a method manufacturing a liquid crystal display according to the invention.
Figure 12:
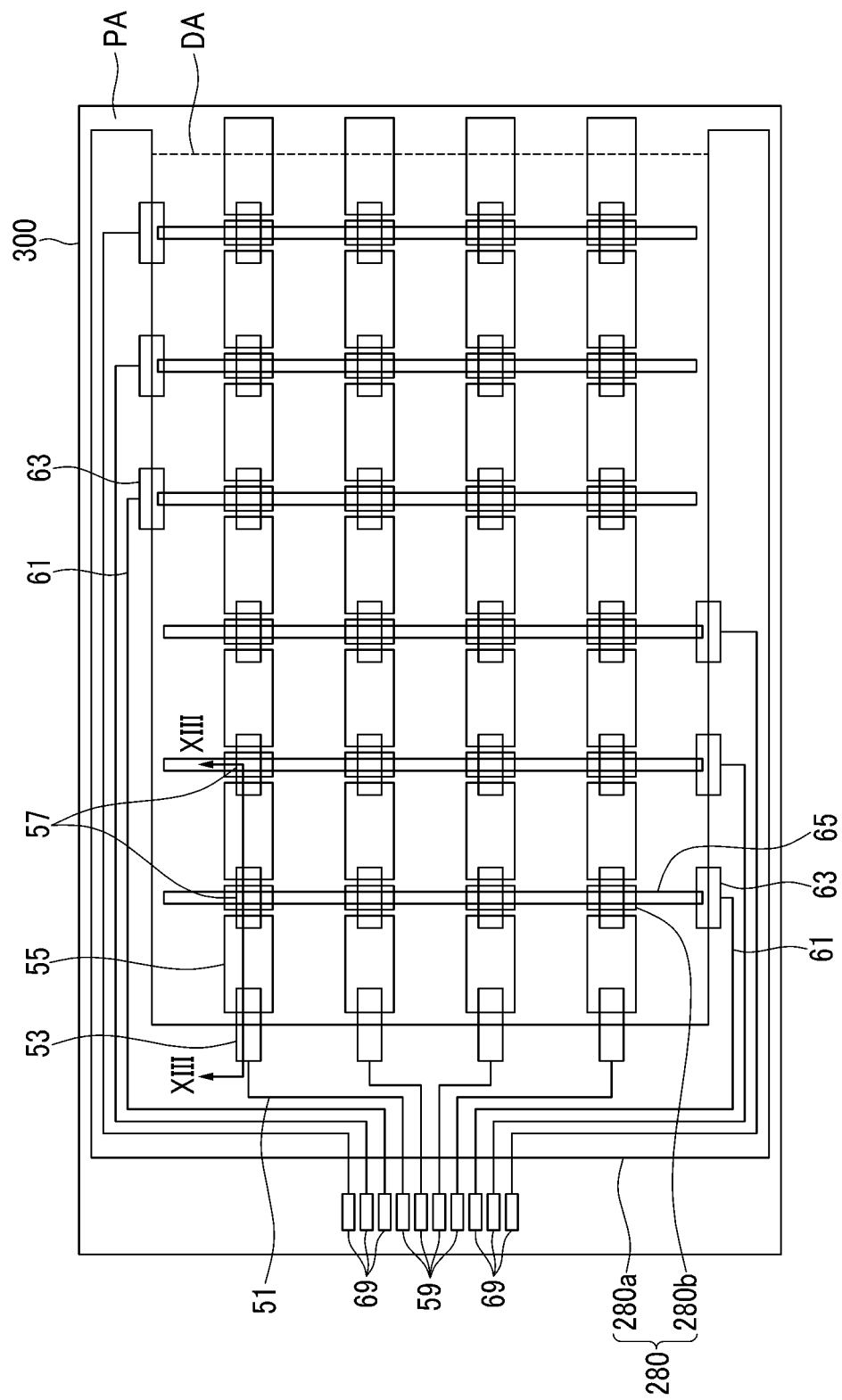
FIG. 12 is a block diagram showing another intermediate step following the step shown in FIG. 10 of an exemplary embodiment of a method of manufacturing a liquid crystal display according to the invention.
Figure 13:
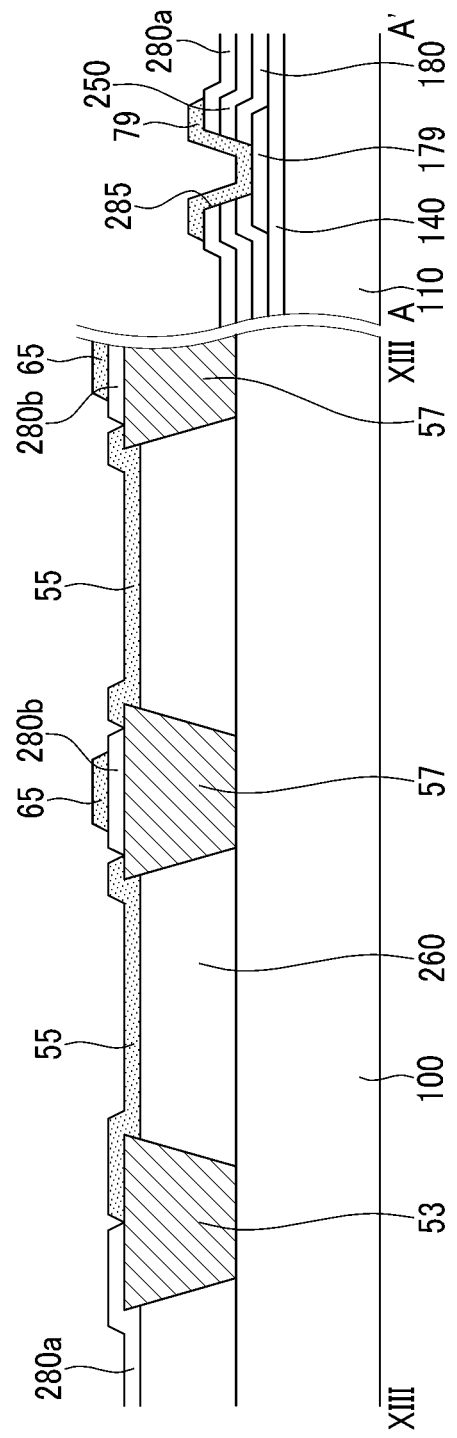
FIG. 13 and FIG. 14 are cross-sectional views taken along line XIII-XIII of the liquid crystal display of FIG. 12 and taken along line A-A' of the liquid crystal display of FIG. 1 sequentially showing an intermediate step of an exemplary embodiment of a method of manufacturing a liquid crystal display according to the invention.
Figure 14:
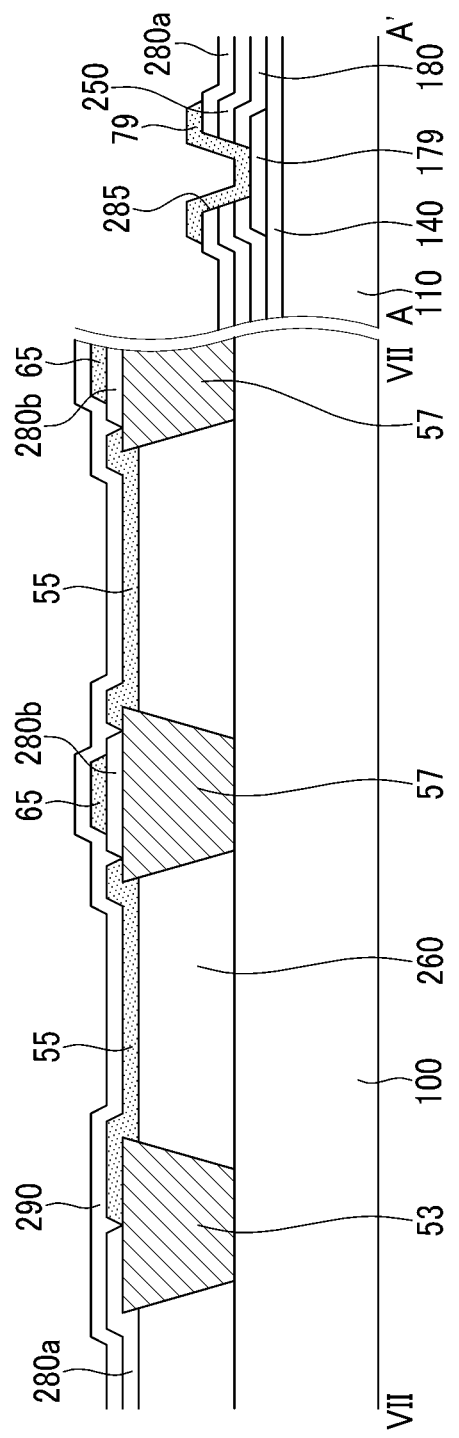

FIG. 6 is a block diagram showing an intermediate step of an exemplary embodiment of a method of manufacturing a liquid crystal display according to the invention, FIG. 7, FIG. 8 and FIG. 9 are cross-sectional views taken along line VII-VII of the liquid crystal display of FIG. 6 and taken along line A-A' the liquid crystal display of FIG. 1, sequentially showing intermediate steps of an exemplary embodiment of a method of manufacturing a liquid crystal display according to the invention, FIG. 10 is a block diagram showing another intermediate step of an exemplary embodiment of a method of manufacturing a liquid crystal display according to the invention, which is a step following the step shown in FIG. 6, FIG. 11 is a cross-sectional view taken along line XI-XI of the liquid crystal display of FIG. 10 and taken along line A-A' of the liquid crystal display of FIG. 1 showing an intermediate step of an exemplary embodiment of a method of manufacturing a liquid crystal display according to the invention, FIG. 12 is a block diagram showing another intermediate step of an exemplary embodiment of a method of manufacturing a liquid crystal display according to the invention, which is a step following the step shown in FIG. 10, and FIG. 13 and FIG. 14 are cross-sectional views taken along line XIII-XIII of the liquid crystal display of FIG. 12 and taken along line A-A' of the liquid crystal display of FIG. 1, sequentially showing intermediate steps of an exemplary embodiment of a method of manufacturing a liquid crystal display according to the invention.

Firstly, referring to FIG. 6 and FIG. 7 as well as the above-described drawings, the thin film transistor is provided on the insulation substrate 110. The thin film transistor may include the gate electrode, the semiconductor, the source electrode and the drain electrode, and the gate insulating layer 140 may be provided between the gate electrode and the semiconductor.

The source electrode of the thin film transistor includes the pad portion 179.

A passivation layer 180, the color filter 230 and the light blocking member 220 are provided, e.g., formed, on the thin film transistor. The pixel electrode 191 including the transparent conductive material or a metal, such as ITO and IZO, for example, is provided on the passivation layer 180, the color filter 230 and the light blocking member 220.

A buffer layer (not shown) including SiOC or the photoresist is provided on the pixel electrode 191, and an opposing electrode 270, an overcoat 250, and a supporting member layer 260' are sequentially provided on the buffer layer.

The overcoat 250 may include silicon nitride (SiNx) or silicon oxide (SiOx).

The supporting member layer 260' may include an organic material having photosensitivity.

The opposing electrode 270, the overcoat 250 and the supporting member layer 260' may be provided over an entire area of the buffer layer, and may fill the open portion OPN. In an exemplary embodiment, the opposing electrode 270, the overcoat 250, and the supporting member layer 260' overlapping the groove GRV may be removed such that a path for removing the buffer layer is provided.

Next, the buffer layer is removed through the groove GRV by an ashing treatment such that the microcavity layer 400 having the liquid crystal injection hole A is provided.

An alignment material is injected through the groove GRV and the liquid crystal injection hole A such that the lower and upper alignment layers 11 and 21 are provided on the pixel electrode 191 and the opposing electrode 270, respectively.

Next, a liquid crystal material including liquid crystal molecules 310 is injected to the microcavity layer 400 through the groove GRV and the liquid crystal injection hole A using capillary force.

In an exemplary embodiment, the display panel unit 100 may be formed by a method as described above.

Next, referring to FIG. 6 and FIG. 7, the supporting member layer 260' is exposed and a plurality of recess portions 265 is formed in the supporting member layer 260'. Each recess portion 265 is formed on the position corresponding to the first touch signal line 51, the second touch signal line 61 and the connecting island 57.

Next, referring to FIG. 6 and FIG. 8, a conductive material 50, e.g., a metal such as silver (Ag) and copper (Cu), is filled in the recess portion 265 of the supporting member layer 260' using Inkjet printing to form the first touch signal line 51, the second touch signal line 61 and the connecting island 57.

Next, referring to FIG. 9, the ashing treatment using oxygen gas is processed on the upper portion of the supporting member layer 260' to reduce the thickness of the supporting member layer 260', such that the supporting member 260 is provided. Thus, a level of the upper surface of the first touch signal line 51, the second touch signal line 61 and the connecting island 57 disposed in the recess portion 265 may be higher than a level of the upper surface of the supporting member 260.

Next, referring to FIG. 10 and FIG. 11, an insulating material layer is provided by coating an inorganic insulating material on the supporting member 260, the first touch signal line 51, the second touch signal line 61 and the connecting island 57, and the insulating material layer is patterned to form an insulating layer 280 including the first insulating layer 280a in the peripheral area PA of the display panel 300 and the second insulating layer 280b in the display area DA.

The first insulating layer 280a covers substantially an entire of the first touch signal line 51 and the second touch signal line 61 in the peripheral area PA of the display panel 300. When patterning the insulating layer 280, the passivation layer 180 and the overcoat 250 on the pad portion 179 of the data line 171 or the pad portion 129 of the gate line 121 in the peripheral area PA may be patterned together, thereby forming a contact hole 285 exposing the pad portions 129 and 179.

The insulating layer 280 may expose at least a portion of the terminal 53 of the first touch signal line 51, at least a portion of the terminal 63 of the second touch signal line 61 and at least a portion of each connecting island 57. In an exemplary embodiment, each connecting island 57 may include exposed end portions disposed opposite to each other with respect to the second insulating layer 280b.

Next, referring to FIG. 12 and FIG. 13, a transparent conductive material, such as ITO and IZO, is deposited on the insulating layer 280 and the connecting island 57, and patterned to form a plurality of first transparent conductive layers 55, a plurality of second transparent conductive layers 65 and a plurality of contact assistants 79 on the first pad portion 59, the second pad portion 69 and the pad portions 129 and 179.

A plurality of portions of the first transparent conductive layers 55 respectively contact a neighboring connecting island 57 to be electrically connected to the neighboring connecting island 57. The second transparent conductive layer 65 is provided on the second insulating layer 280b at a portion crossing the first transparent conductive layer 55 to be insulated from the first transparent conductive layer 55.

The contact assistant 79 is connected to the pad portion 129 of the gate line 121 or the pad portion 179 of the data line 171 through the contact hole 285.

Next, referring to FIG. 14, a capping layer 290 may be provided on the insulating layer 280, the first transparent conductive layer 55 and the second transparent conductive layer 65.

As described above, in an exemplary embodiment of the manufacturing method of the liquid crystal display according to the invention, the manufacturing process is substantially simplified and the cost is substantially reduced. In such an embodiment, the volume and the weight of the liquid crystal display are substantially reduced.

Next, an exemplary embodiment of a manufacturing method of the liquid crystal display including the touch sensor according to the invention will be described with reference to FIG. 15 to FIG. 18. The same or like elements shown in FIGS. 15 to 18 have been labeled with the same reference characters as used above to describe the exemplary embodiments of the liquid crystal display shown in FIGS. 6 to 14, and any repetitive detailed description thereof will hereinafter be omitted or simplified.

FIG. 15, FIG. 16, FIG. 17 and FIG. 18 are cross-sectional views showing intermediate steps of an exemplary embodiment of a method of manufacturing a liquid crystal display according to the invention.

The manufacturing method of the liquid crystal display of FIGS. 15 to 18 is substantially the same as the manufacturing method of the liquid crystal display shown in FIGS. 6 to 14 except for the manufacturing method of the pad portion 179 of the data line 171 or the pad portion 129 of the gate line 121. The same or like elements shown in FIGS. 15 to 18 have been labeled with the same reference characters as used above to describe the exemplary embodiments of the liquid crystal display shown in FIGS. 6 to 14, and any repetitive detailed description thereof will hereinafter be omitted or simplified.

Figure 15:
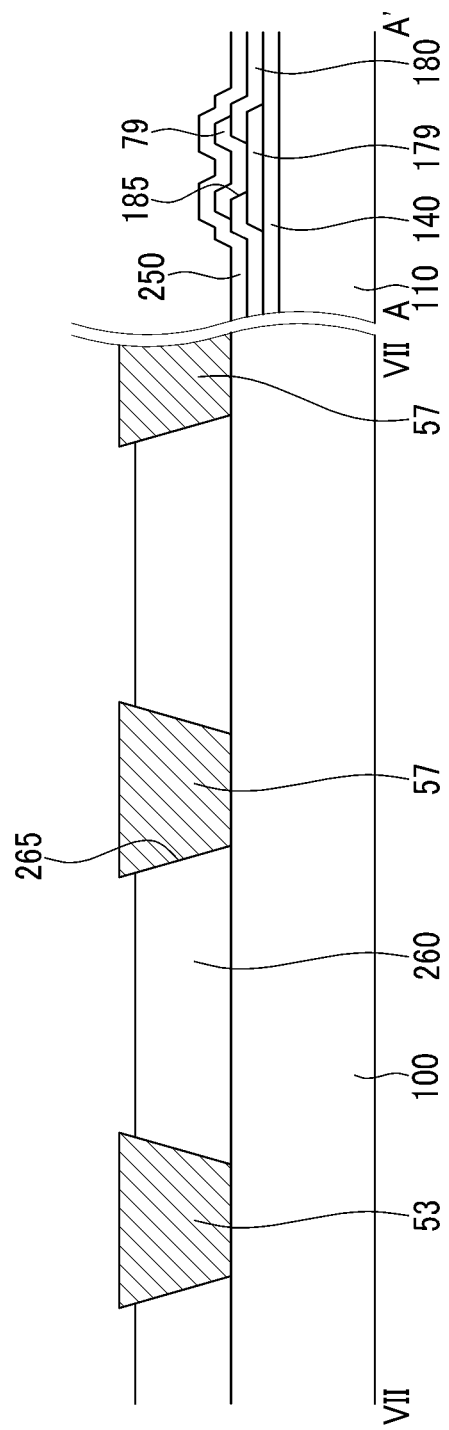
FIG. 15, FIG. 16, FIG. 17 and FIG. 18 are cross-sectional views showing intermediate steps of an exemplary embodiment of a method of manufacturing a liquid crystal display according to the invention.

Firstly, referring to FIG. 15 along with FIG. 9, when a passivation layer 180 is provided on the thin film transistor on the substrate 110 and the passivation layer 180 is patterned, the contact hole 185 exposing the pad portion 179 of the data line 171 or the pad portion 129 of the gate line 121 may also be provided.

Next, when providing the pixel electrode 191 on the passivation layer 180, the contact assistant 79 contacting the pad portion 179 of the data line 171 or the pad portion 129 of the gate line 121 through the contact hole 185 may be provided using a same material as the formation material of the pixel electrode 191, for example, the transparent conductive material such as IZO and ITO.

In an exemplary embodiment, the several layers such as the microcavity layer 400 and the overcoat 250 are provided on the pixel electrode 191 to form the display panel unit 100.

Figure 16:
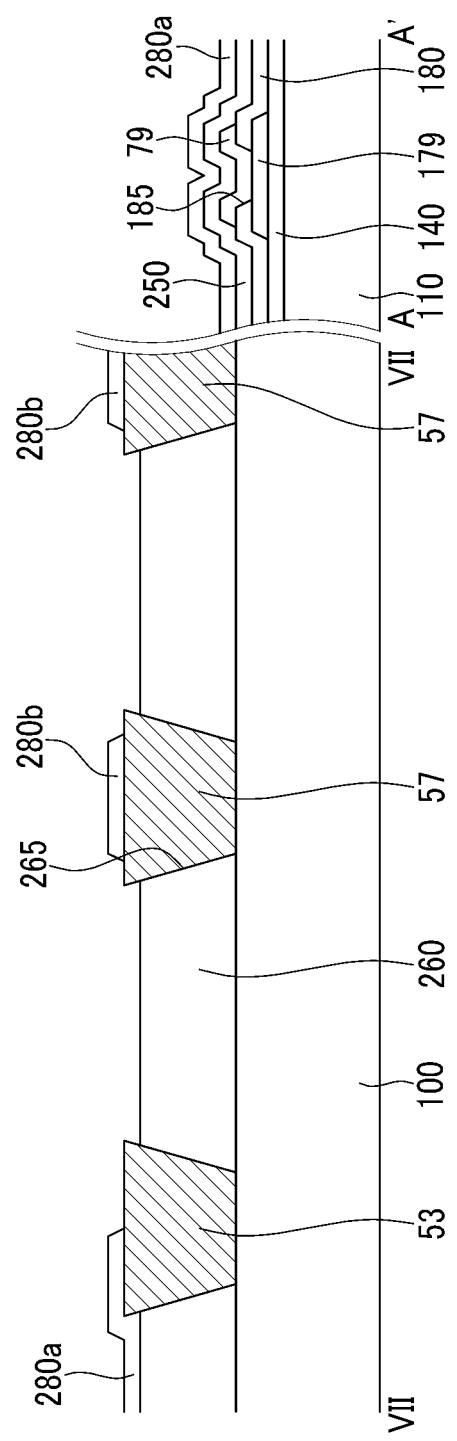

Next, referring to FIG. 16, the insulating layer 280 including the first insulating layer 280a and the second insulating layer 280b is provided on the supporting member 260, the first touch signal line 51, the second touch signal line 61 and the connecting island 57. In such an embodiment, the first insulating layer 280a in the peripheral area PA of the display panel 300 may be provided to cover the contact assistants 79.

Figure 17:
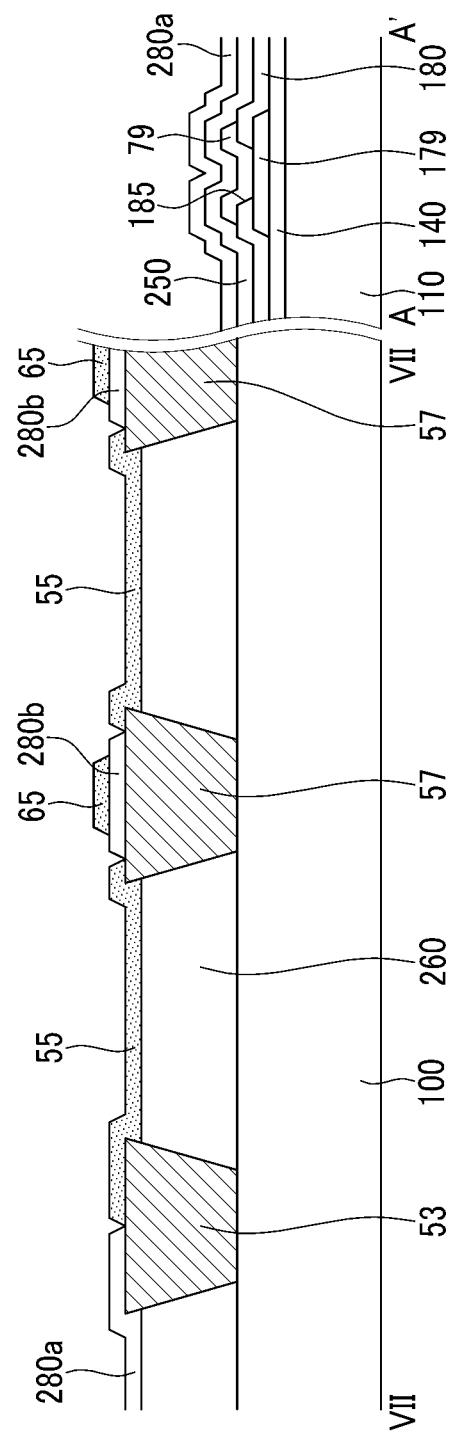

Next, referring to FIG. 17, a plurality of first transparent conductive layers 55, second transparent conductive layers 65, first pad portions 59 and second pad portions 69 are provided on the insulating layer 280 and the connecting island 57.

Figure 18:
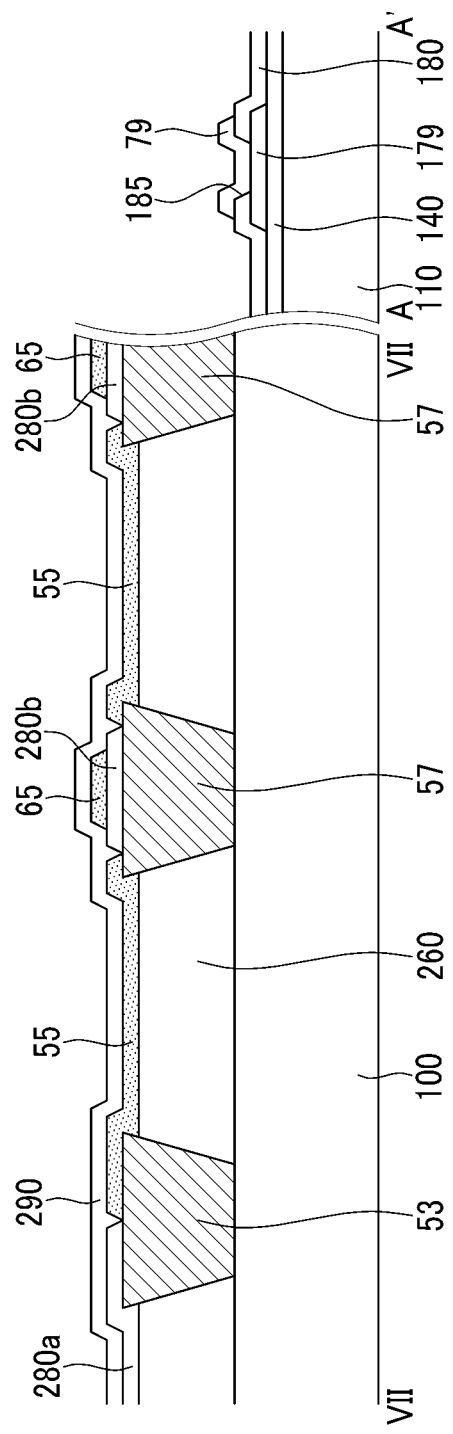

Next, referring to FIG. 18, the capping layer 290 is provided on the insulating layer 280, the first transparent conductive layer 55 and the second transparent conductive layer 65. In such an embodiment, the overcoat 250, the first insulating layer 280a and the capping layer 290 covering the contact assistants 79 contacting the pad portion 179 of the data line 171 or the pad portion 129 of the gate line 121 are removed to expose the contact assistants 79.

As described, the contact assistants 79 provided along with the pixel electrode 191 of the transparent conductive material such as ITO and IZO is exposed after providing the first transparent conductive layer 55 and the second transparent conductive layer 65 such that lifting of or damage to the contact assistant 79 is effectively prevented.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display comprising:
a substrate;
a thin film transistor disposed on the substrate;
a pixel electrode connected to a terminal of the thin film transistor;
a microcavity layer disposed on the pixel electrode, wherein the microcavity layer comprises a liquid crystal material;
a supporting member disposed on the microcavity layer, wherein a plurality of recess portions are defined in an upper major surface plane defining the supporting member, and each of the recess portions has opposing sidewalls defining the each recess portion; and
a plurality of touch signal lines disposed on the supporting member,
wherein at least one of the touch signal lines has a portion which is disposed in the recess portions, and
the portion of the touch signal line which is disposed in the recess portion contacts the opposing sidewalls of the recess portion.

2. The liquid crystal display of claim 1, further comprising:
a first insulating layer disposed on the plurality of touch signal lines.

3. The liquid crystal display of claim 2, wherein
the plurality of touch signal lines comprises a terminal, at least a portion of which is exposed by the first insulating layer.

4. The liquid crystal display of claim 3, further comprising:
a plurality of transparent conductive layers connected to the plurality of touch signal lines.

5. The liquid crystal display of claim 4, further comprising:
a plurality of connecting islands disposed in the plurality of recess portions; and
a second insulating layer disposed on the connecting islands,
wherein the plurality of transparent conductive layers comprises a first transparent conductive layer comprising a plurality of portions connected to each other through the plurality of connecting islands.

6. The liquid crystal display of claim 5, wherein
the plurality of transparent conductive layers further comprises a second transparent conductive layer, wherein the first and second transparent conductive layers collectively define a touch sensor, and
the second transparent conductive layer is insulated from the connecting islands via the second insulating layer.

7. The liquid crystal display of claim 6, further comprising:
a signal line disposed on the substrate and connected to the thin film transistor; and
a contact assistant connected to the signal line,
wherein
the signal line comprises a pad portion disposed at an end thereof,
the first insulating layer comprises a contact hole which exposes the pad portion, and
the contact assistant is connected to the pad portion through the contact hole.

8. The liquid crystal display of claim 6, further comprising:
a signal line disposed on the substrate and connected to the thin film transistor,
a contact assistant connected to the signal line,
wherein
the signal line comprises a pad portion disposed at an end; and
the contact assistant is disposed in a same layer as the pixel electrode and connected to the pad portion of the signal line.

9. The liquid crystal display of claim 1, wherein the portion of the touch signal line which is disposed in the recess portion fills the recess portion.

* * * * *